United States Patent
Burkhard et al.

[11] Patent Number: 5,150,063
[45] Date of Patent: Sep. 22, 1992

[54] BRIDGE FOR MEASURING THE REFLECTION COEFFICIENT

[75] Inventors: Wolfgang Burkhard, Baierbrunn; Klaus Danzeisen, Gräfelfing, both of Fed. Rep. of Germany

[73] Assignee: Rohde & Schwarz GmbH & Co. KG, Fed. Rep. of Germany

[21] Appl. No.: 725,467

[22] Filed: Jul. 3, 1991

[30] Foreign Application Priority Data

Jul. 10, 1990 [DE] Fed. Rep. of Germany ....... 4021944

[51] Int. Cl.$^5$ ............................................. G01R 27/28
[52] U.S. Cl. ..................................... 324/646; 324/648
[58] Field of Search ............... 324/638, 642, 646, 648; 333/26

[56] References Cited

U.S. PATENT DOCUMENTS

| | | | |
|---|---|---|---|
| 3,227,953 | 1/1966 | Cerveny | 324/153 |
| 3,860,218 | 3/1974 | Shekel | 324/646 |
| 4,962,359 | 10/1990 | Dunsmore | 324/646 |

FOREIGN PATENT DOCUMENTS

1041152 10/1953 Fed. Rep. of Germany .

OTHER PUBLICATIONS

Siemens Aktiengesellschaft, "Funk-Entstoer-Bauelemente", 1977/78.
Rohde & Schwarz GmbH & Co. K.G. SWR Bridge ZRB 2.

Primary Examiner—Kenneth A. Wieder
Assistant Examiner—Maura K. Regan
Attorney, Agent, or Firm—Hill, Van Santen, Steadman & Simpson

[57] ABSTRACT

In a reflection-coefficient bridge, the voltage drop across a neutral arm of the bridge is supplied to the indicator via a coaxial cable. The center conductor of the coaxial cable is coupled to the one connecting point of the neutral arm of the bridge while the outer conductor thereof is coupled to the other connecting point thereof. The coaxial cable and a parallel-connected line portion constitute a balanced converter or balun. Both the coaxial cable and the line portion are wound onto at least one ferrite core. A d.c. voltage is fed to a test object, which is connected to the bridge by way of a coaxial line, through a compensating winding wound on at least one of said ferrite cores to the end of the line portion which is r.f. coupled to the frame.

10 Claims, 2 Drawing Sheets

BRIDGE FOR MEASURING THE REFLECTION COEFFICIENT

BACKGROUND OF THE INVENTION

1. Field of the Invention

The invention is directed to a reflection-coefficient bridge for measuring magnitude and phase of the reflection coefficient of components such as filters, amplifiers, mixers or antennas.

2. Description of the Prior Art

Reflection-coefficient bridges of the specified kind are known (e.g. bridge ZRB2 of Rohde & Schwarz). With bridges of this kind, both the radio-frequency signal source and the test object are connected via coaxial sockets. Some test objects require simultaneous d.c. feeding during the measuring operation through the coaxial connector to the components such as transistors or diodes provided in the test object. It is known to dispose a special coaxial adapter between test object and bridge to achieve this purpose. It is also known to supply the direct current through one of the bridge resistors and to this end to connect the r.f. signal source to the neutral arm of the bridge via a converter (U.S. Pat. No. 3,227,953). All of these known measures have the drawback that the bridge symmetry is thereby affected and consequently the characteristics of the bridge are deteriorated.

SUMMARY OF THE INVENTION

It is an object of the present invention to provide a circuit for feeding a d.c. voltage to a test object connected via a coaxial cable to a reflection-coefficient bridge whereby the bridge characteristics are not deteriorated.

The specified object is achieved by a reflection-coefficient bridge wherein a bridge having a neutral arm is provided in the frame which houses the bridge system. A balun means is provided for supplying to an indicator a voltage drop across the neutral arm of the bridge. The balun means has a coaxial cable, a center conductor of which is coupled to one connecting point while an outer conductor thereof is coupled to another connecting point of the neutral arm of the bridge. The coaxial cable is wound onto at least one ferrite core. A line portion is also provided connected in parallel to the coaxial cable. One end of the line portion together with the center conductor of the coaxial cable is coupled to the one connecting point of the neutral arm of the bridge. The line portion is likewise wound onto at least one ferrite core. Means is provided for feeding a DC voltage to a test object connected to the bridge through a coaxial line. This means comprises a compensating winding which is wound onto at least one of the ferrite cores and leads to an end of the line portion of the balun, which end is r.f. connected to the frame.

Due to the compensation in accordance with the invention at the balanced converter or balun of the bridge, the externally supplied direct current flows through the compensating winding and also, in opposite sense, through the main winding of the balun branch formed by the line portion, so that two magnetic fluxes having the same magnitude but opposite sense are induced in the associated ferrite core which cancel each other out. Thus, magnetic saturation of the ferrite core even in the case of high direct currents is avoided, and the symmetry of the bridge as well as its directivity and matching are not deteriorated. Hence, it becomes possible for the first time to feed direct current via the bridge to components provided in the test object without any deterioration of the bridge characteristics. Since the bridge symmetry is not disturbed when direct current is supplied in accordance with the present invention, this feeding mode is suited also for bridges which can be used within a wide frequency range of up to 5 GHz or more.

There are several ways of designing the compensating winding. It is especially advantageous to provide a second compensating winding on the ferrite core of the other balun branch formed by the coaxial cable although the second winding is not used for d.c. feeding but is provided only for reasons of r.f. symmetry; such an arrangement offers the advantage that the bridge symmetry will remain largely unaffected independently of the frequency even if high direct currents are fed.

BRIEF DESCRIPTION OF THE DRAWINGS

Other objects, features and advantages of the invention, its organization, construction and operation will be best understood from the following detailed description taken in conjunction with the accompanying drawings.

DESCRIPTION OF THE PREFERRED EMBODIMENTS

Figure 1:
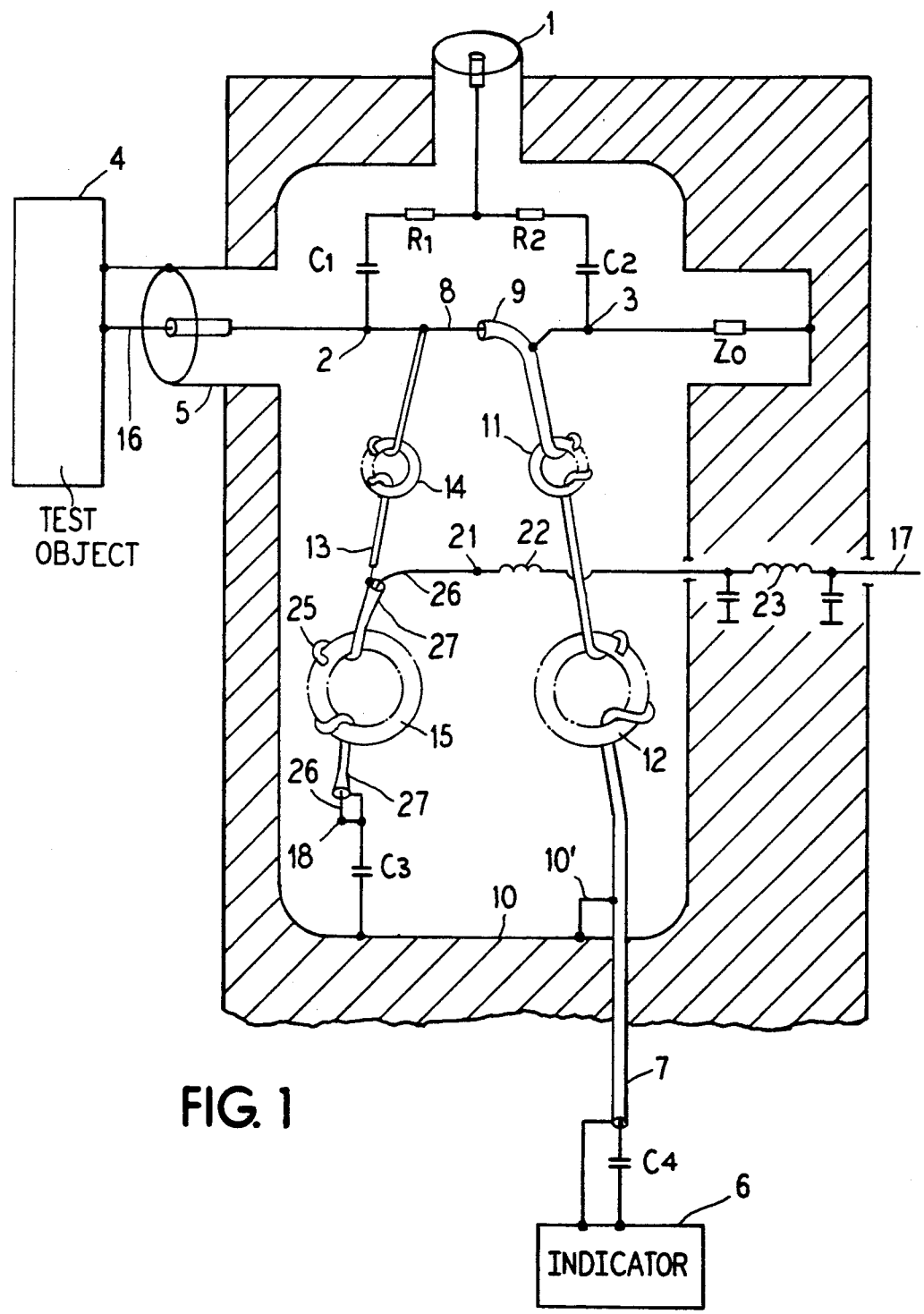
FIG. 1 is a schematic illustration of the bridge system of the invention.

FIG. 1 illustrates the basic layout of a reflection-coefficient bridge; the r.f. input 1 is coupled via a coaxial socket to a r.f. generator, not illustrated; the two connecting points 2 and 3 of the neutral arm of the bridge are fed via the two bridge arms R1, R2; the test object 4 is coupled through a coaxial socket 5 between the connecting point 2 and frame to form a third bridge arm; the shunt resistor $Z_0$ is coupled as a fourth bridge arm between the connecting point 3 and frame. The indicator 6 is coupled via a coaxial cable 7 to the connecting points 2 and 3 of the neutral arm of the bridge, the center conductor 8 of said cable 7 being coupled to the connecting point 2 while the outer conductor 9 is coupled to the connecting point 3. The bottom end of the outer conductor 9 of the coaxial cable 7 is connected to frame 10 (bridge housing).

To prevent a r.f. short-circuit to the frame of the connecting point 3 of the neutral arm of the bridge via the outer conductor 9 of the coaxial cable 7, ferrite cores 11 and 12 are mounted on the outer conductor 9. These ferrite cores determine the low-end cutoff frequency of the bridge. To obtain a large bandwidth, two different ferrite cores 11 and 12 are provided onto which the coaxial cable is wound with respectively different numbers of turns ($N_1$ and $N_2$). To restore the bridge symmetry, an additional line portion 13 is provided in parallel with the ferrite core-loaded coaxial cable 7, one end of said line portion being again coupled to the connecting point 2 of the neutral arm of the bridge and the other end thereof being r.f. connected to frame 10 via frame connecting line 10' through a capacitor C3. This line portion 13 again is provided with two ferrite cores 14 and 15, and the line portion 13 is wound with different numbers of turns ($N_1$ and $N_2$) onto the different-sized ferrite cores 14 and 15. The coaxial cable 9 including the ferrite cores mounted thereon and the line portion 13 including the ferrite cores likewise mounted thereon constitute a balun, the two halves of which should be of mirror-symmetrical design.

The capacitors C1, C3 and C4 have been provided for d.c. separation of the measuring input 5, while the capacitor C2 is provided for reasons of symmetry.

For d.c. feeding active components in the test object 4 via the center conductor feeder 16 thereof, the d.c. voltage desired for the test object 4 is fed from a d.c. power source through the terminal 17 to the connecting point 18 which is r.f. connected to the frame via the capacitor C3. To prevent magnetic saturation of the ferrite core 15 in case of higher d.c. currents and a consequent deterioration of the bridge symmetry, the direct current is fed to the connecting point 18 via a compensating winding which, in addition to the line portion 13, is wound onto the ferrite core 15, preferably with the same number of turns $N_2$.

FIG. 1 illustrates a first possible way of configuring this additional compensating winding on the ferrite core. In the illustrated embodiment, it is formed by the center conductor 26 of a length 25 of coaxial cable the outer conductor of which constitutes the extension of the line portion 13, so that in the instant embodiment the winding 25 of the line portion 13 on the ferrite core 15 is formed by a short length 25 of coaxial cable. At the end 18 of the line portion 13, which end is r.f. connected to the frame, the center conductor 26 is directly coupled to the outer conductor 27 of said length of coaxial cable, and this connecting point in its turn is r.f. connected to the frame via the capacitor C3. The opposite end 21 of the center conductor 26 is coupled to the d.c. voltage input terminal 17 via a r.f. choke 22 and a low-pass filter 23. The r.f. choke 22 provides for r.f. separation between the connecting point of the compensating winding and the d.c. voltage input terminal 17. The d.c. feed current for the test object 4 therefore flows through the center conductor 26 to the end 18, which is r.f. connected to the frame, then flows in an opposite sense through the outer conductor 27 and the subsequent line portion 13 to the bridge connecting point 2, and then via the center conductor 16 into the test object 4.

Figure 2:
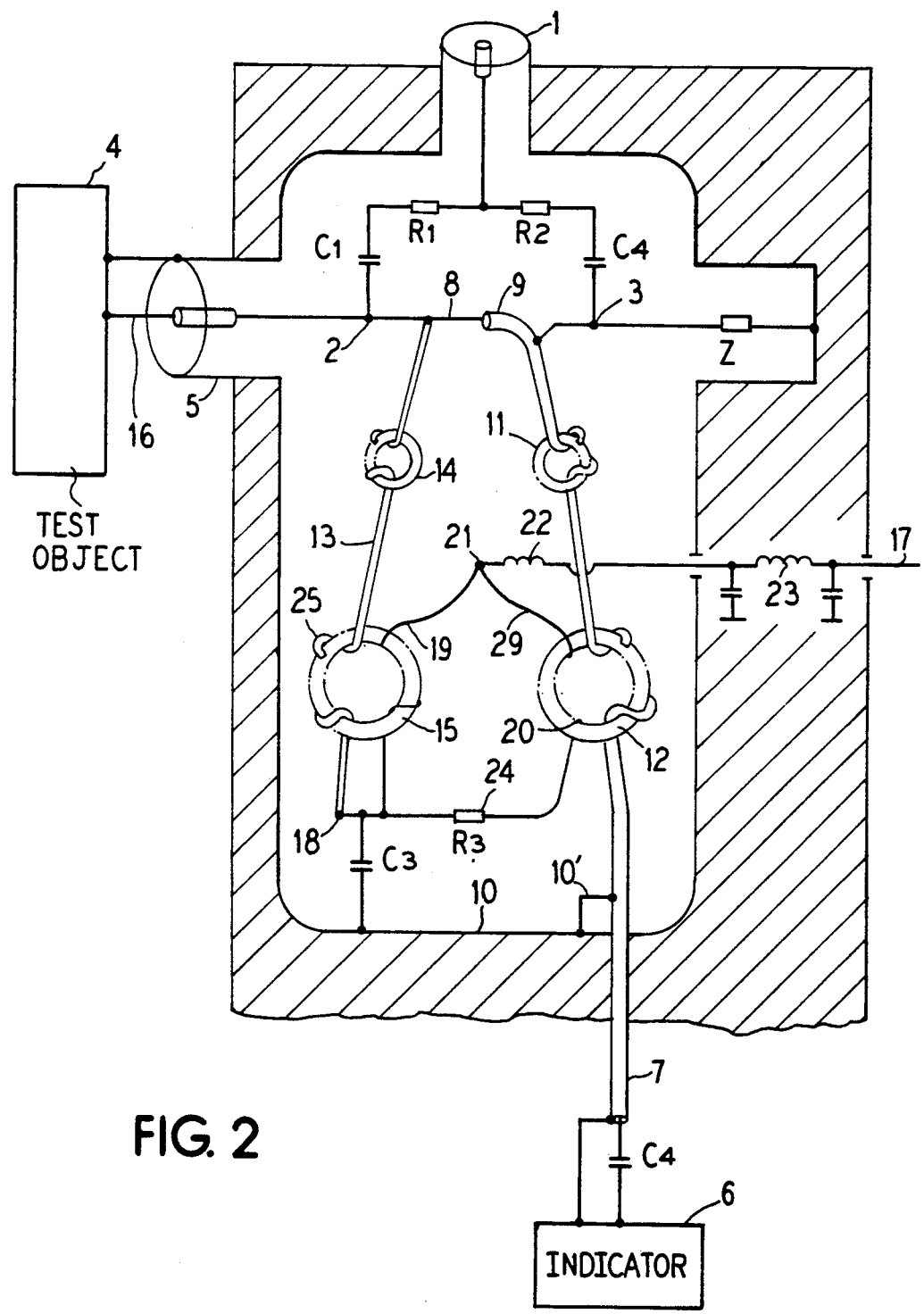
FIG. 2 is an alternate embodiment of the bridge system of FIG. 1.

FIG. 2 shows a more wide-band embodiment of the compensating winding for the d.c. feed current. In this embodiment the compensating winding is formed by an additional wire winding 19 on the ferrite core 15 which in the illustrated embodiment is wound in an opposite sense relative to the winding 15. With the direction of the current through the windings 19 and 25 being the same, opposite magnetic fields are induced in the ferrite core which cancel each other out. The winding 19 may also be wound with the same winding sense as the winding 25 provided care is taken that the direction of the current in the winding 19 is opposite to that in the winding 25. Here, too, the number of turns of the winding 19 is preferably selected to be equal to that of the winding 25. The upper end 21 of the wire winding 19 is coupled to the r.f. choke 22 while the other end thereof is coupled to the frame connection 18. For reasons of symmetry the ferrite core 12 of the coaxial cable 7 of the other half of the balun is provided with a similar compensating winding 20 with the same number of turns as the winding 19, whereas the winding sense, depending on the direction of the current, is either the same as or opposite to the winding sense of the coaxial cable 7. The upper end 29 of this compensating winding 20 is coupled via the end 21 of the other compensating winding 19 to the r.f. choke 22, and the lower end 28 in the illustrated embodiment is coupled via a resistor 24 to the connecting point 18. The direct current fed through the choke 22 therefore flows essentially through the compensating winding 19 to the connecting point 18 and then in an opposite sense through the compensating winding 19 to the connecting point 18 where it flows in an opposite sense through the winding 25 and the line portion 13 and again to the bridge connecting point 2. Because of the resistor 24, only a relatively small current flows in the second compensating winding 20 so that with respect to d.c. the major current portion flows directly to the connecting point whereas with respect to r.f. both balun arms are symmetrically loaded with similar compensating windings 19 and 20. Instead of providing the resistor 24, the end 28 of the compensating winding 20 could also be directly r.f. coupled to the frame connecting point 10, for example via a capacitor, so that no direct current will flow through the winding 20 and the winding 20 only fulfils its tasks of providing for r.f. symmetry.

It would not even be necessary to provide for electrical connection of the additional compensating winding 20 to the connecting point 21 of the compensating winding 19; rather, the lower end 28 thereof could, for instance, be directly coupled to frame 10 while its free upper end 29 would be r.f. connected to the frame through an additional r.f. choke, which is provided for reasons of symmetry and corresponds to the choke 22, and through a capacitor; in this case it will also fulfil its task of providing for r.f. symmetry while no d.c. feed current would pass therethrough. In the illustrated embodiments, only the larger ferrite core 15 (and the ferrite core 12, respectively) is provided with a corresponding compensating winding 19 and 26 (or 20), respectively, but when two or more such ferrite cores are provided for each balun half as illustrated in the embodiment, corresponding compensating windings may, if necessary, also be wound onto these additional ferrite cores, i.e. onto the ferrite core 14 in the embodiment shown in FIG. 1 and onto the ferrite core 11 and the ferrite core 14 in the embodiment shown in FIG. 2.

Although we have described our invention by reference to particular illustrative embodiments thereof, many changes and modifications of the invention may become apparent to those skilled in the art without departing from the spirit and scope thereof. We therefore intend to include within the patent warranted hereon all such changes and modifications as may reasonably and properly be included within the scope of our contribution to the art.

We claim:

1. A bridge system for measuring a reflection coefficient, comprising:
 a frame;
 a bridge having a neutral arm provided in the frame;
 a balun means for supplying to an indicator a voltage drop across the neutral arm of the bridge;
 said balun means having a coaxial cable, a center conductor of which is coupled to one connecting point while an outer conductor thereof is coupled to another connecting point of the neutral arm of the bridge, said coaxial cable being wound onto at least one ferrite core, and a line portion connected in parallel to said coaxial cable, one end of said line portion together with the center conductor of the coaxial cable being coupled to said one connecting point of the neutral arm of the bridge and said line portion being likewise wound onto at least one ferrite core; and means for feeding a d.c. voltage to a test object connected to the bridge through a coaxial line, said means comprising a compensating winding which is wound onto at least one of said ferrite cores and leads to an end of the line portion of the balun, said end being r.f. connected to the frame.

2. The bridge as claimed in claim 1, wherein the d.c. voltage is coupled through a r.f. choke to an end of the compensating winding remote from the r.f. frame connection.

3. The bridge as claimed in claim 1 wherein at least a part of the line portion of the balun wound onto one of said ferrite cores is formed by an outer conductor of a length of coaxial cable whose end is r.f. connected to the frame, a center conductor of said length of coaxial cable forming the compensating winding and an end thereof being coupled to an end of the outer conductor which is r.f. connected to the frame.

4. The bridge as claimed in claim 1 wherein the compensating winding is formed by a winding which is wound onto at least one of said ferrite cores in addition to the winding of said line portion.

5. The bridge as claimed in claim 4 wherein a further compensating winding formed by a portion of the coaxial cable part of said balun is also wound onto at least one of the ferrite cores of said balun.

6. The bridge as claimed in claim 5 wherein said further compensating winding also has its one end connected to said d.c. power supply.

7. The bridge as claimed in claim 6 wherein the end of said further compensating winding remote from the end connected to the d.c. power supply is r.f. connected to the frame.

8. The bridge as claimed in claim 6 wherein the end of said further compensating winding which is remote from the end connecting to the d.c. power supply is connected via a resistor to the end of the compensating winding of the line portion of the balun which is r.f. connected to the frame.

9. The bridge as claimed in claim 1 wherein the d.c. voltage is fed through a low-pass filter.

10. A bridge system for measuring a reflection coefficient resulting from r.f. signals fed from an r.f. generator through the bridge system to a test object connected to the bridge system, comprising:

a bridge having first and second bridge arms connected at one end to an r.f. input at which the r.f. generator may be connected, an opposite end of the first bridge arm connecting through a shunt resistor to a frame for the bridge system, and an opposite end of the second bridge arm connecting to a coaxial connection to which the test object is connected;

a coaxial cable leading from an indicator input for the bridge system to the bridge, and wherein a portion of the coaxial cable is wound on a ferrite core, an outer conductor of the coaxial cable at the bridge connecting to the second end of the first bridge arm and an inner conductor of the coaxial cable connecting to the second end of the second bridge arm;

a line having a portion thereof wound on a ferrite core, with one end of the line portion connecting to the second end of the second bridge arm and having its other end r.f. connected to the frame; and a d.c. power source connecting through a compensating winding on one of the ferrite cores to the end of said line where it is r.f. connected to the frame.

* * * * *